(12) United States Patent
Pogorelik et al.

(10) Patent No.: US 10,833,525 B2
(45) Date of Patent: Nov. 10, 2020

(54) CHARGING MINIATURE DEVICES

(71) Applicant: Intel Corporation, Santa Clara, CA (US)

(72) Inventors: Oleg Pogorelik, Lapid (IL); Avi Priev, Petach-Tikva (IL); Shahar Porat, Hof Hacarmel (IL); Songnan Yang, San Jose, CA (US); Boyan Yanakiev, Aalborg (DK)

(73) Assignee: Intel Corporation, Santa Clara, CA (US)

( * ) Notice: Subject to any disclaimer, the term of this patent is extended or adjusted under 35 U.S.C. 154(b) by 85 days.

(21) Appl. No.: 16/307,331

(22) PCT Filed: Jul. 1, 2016

(86) PCT No.: PCT/US2016/040867
§ 371 (c)(1),
(2) Date: Dec. 5, 2018

(87) PCT Pub. No.: WO2018/004694
PCT Pub. Date: Jan. 4, 2018

(65) Prior Publication Data
US 2019/0140472 A1    May 9, 2019

(51) Int. Cl.
*H02J 7/02* (2016.01)
*H02J 50/80* (2016.01)
(Continued)

(52) U.S. Cl.
CPC ............ *H02J 7/025* (2013.01); *H02J 7/0013* (2013.01); *H02J 50/10* (2016.02); *H02J 50/80* (2016.02);
(Continued)

(58) Field of Classification Search
USPC ........................................................ 320/108
See application file for complete search history.

(56) References Cited

U.S. PATENT DOCUMENTS

| | | | |
|---|---|---|---|
| 2002/0095239 A1 | 7/2002 | Wallach et al. | |
| 2011/0093139 A1 | 4/2011 | Arms et al. | |
| 2014/0349630 A1* | 11/2014 | Hyde | H04B 7/026 455/418 |

FOREIGN PATENT DOCUMENTS

| | | |
|---|---|---|
| JP | 2012043072 A | 3/2012 |
| KR | 1020110124587 A | 11/2011 |
| KR | 1020140120437 A | 10/2014 |

OTHER PUBLICATIONS

International Search Report for Related PCT Application PCT/US2016/040867 filed Jul. 1, 2017 dated Mar. 27, 2017, 3 pages.

* cited by examiner

Primary Examiner — Bryce M Aisaka
(74) Attorney, Agent, or Firm — Schiff Hardin LLP

(57) ABSTRACT

Techniques for wirelessly charging small power receiving units are disclosed. An example power receiving unit includes a transportation mechanism to enable the power receiving unit to move and a wireless communication system that enables the power receiving unit to communicate with a plurality of other power receiving units. The power receiving unit is a master unit and the other power receiving units are nodes that take commands from the master unit. The power receiving unit also includes a controller to command the nodes to form a composite receive coil over a power transmitting unit and communicate with the power transmitting unit to start a charging session.

25 Claims, 8 Drawing Sheets

(51) Int. Cl.
*H02J 7/00* (2006.01)
*H02J 50/10* (2016.01)
*H02J 50/90* (2016.01)
*G01R 19/165* (2006.01)

(52) U.S. Cl.
CPC ........ *H02J 50/90* (2016.02); *G01R 19/16542* (2013.01); *H02J 7/00034* (2020.01)

102

410

CHARGING MINIATURE DEVICES

CROSS REFERENCE TO RELATED APPLICATIONS

Pursuant to 35 U.S.C. § 371, this application is the United States National Stage Application of International Patent Application No. PCT/US2016/040867, filed Jul. 1, 2016, the contents of which are incorporated by reference as if set forth in their entirety herein.

TECHNICAL FIELD

This disclosure relates generally to techniques for wirelessly powering devices. Specifically, the disclosure describes techniques for charging miniature devices, including miniature robotic devices.

BACKGROUND

As computer miniaturization progresses more and more products will be equipped with some form of sensing, computing, wireless communication abilities, and the like. The networking of objects through embedded electronics is sometimes referred to as Internet of Things (IoT). Electronics for enabling IoT can be embedded into a variety of objects, such as watches, bracelets, pens, keys, badges, and flash drives. Additionally, miniaturization of electronic devices has made it possible to embed IoT capability into small robotic devices. Such robotic devices may be used for entertainment, environmental monitoring, and other purposes.

BRIEF DESCRIPTION OF DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DETAILED DESCRIPTION

The subject matter disclosed herein relates to wireless charging techniques. As explained above, electronics are increasingly being embedded in a wide variety of IoT devices, including miniature robotics. In such devices, electrical power provided by a battery may be used for sensing, data processing, data transmission, and movement. Recharging miniature IoT devices through wired power connections may be inconvenient and cumbersome due to the small size of the devices and possible number of devices that may be in use.

The small size of the devices also makes it difficult to charge the devices wirelessly. This is because wireless power transfer that is based on magnetic coupling depends on the coil sizes of the power transmitter and power receiver. In a miniature device, the power receiving coil that could be contained within the device would be much smaller than most power transmitting coils. This size difference results in inefficient power transfer from the transmitter to the receiver and a charging process that would take many hours. Additionally, today's protocols for wireless charging can support only a few power receiving units charging in parallel. For example, an A4WP (AirFuel) power charger can support up to 8 devices to be charged at a time.

The present disclosure describes low cost and effective techniques of wirelessly charging one or many miniature IoT devices such as swarm robots without changing their shape, size, or adding expensive components. In an example system, the several small battery powered devices can be chained together in such a way that the several devices together form a composite receiving coil that can be approximately the same size as the transmitter coil. In this way, power can be transmitted to the receiver coil with greater efficiency. Each individual miniature IoT device can receive a portion of the electrical energy received by the receiver coil for charging its battery.

Figure 1:
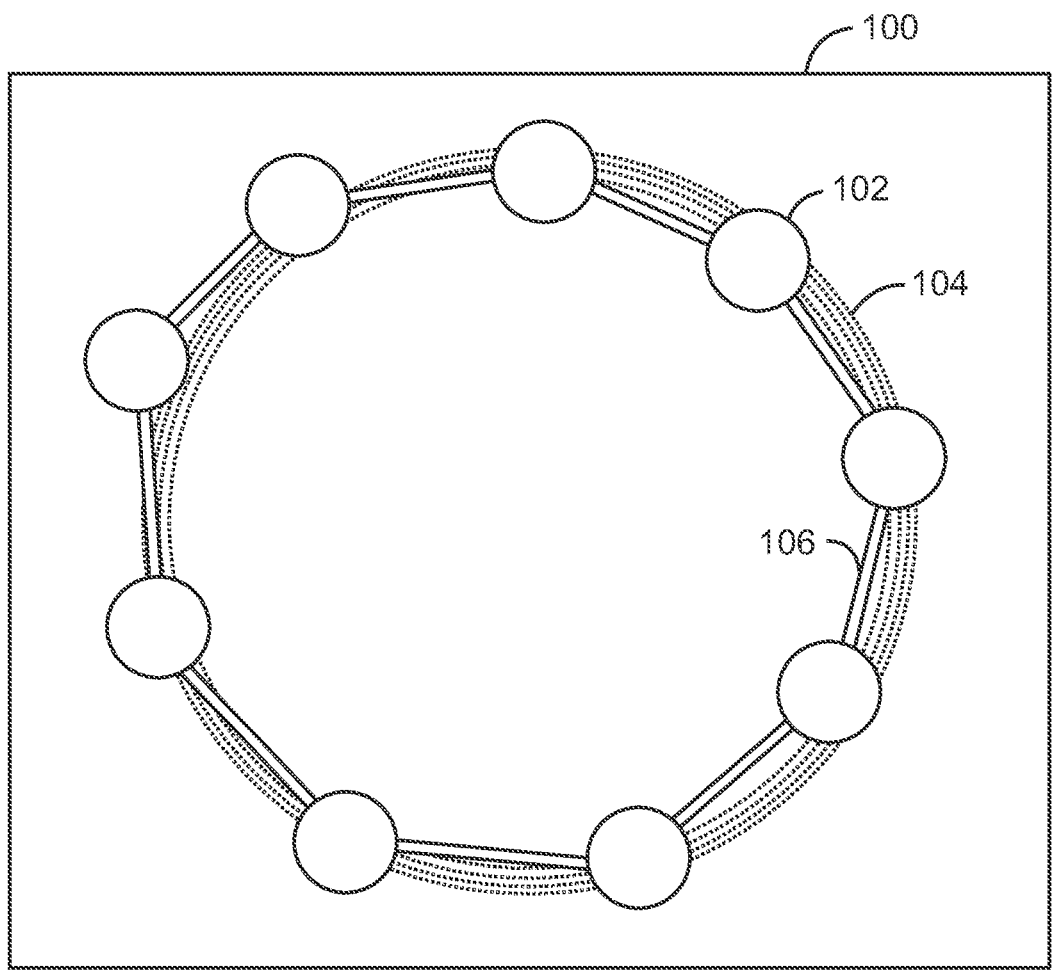
FIG. 1 is an illustration of a group of devices chained together to form a composite receiving coil.

FIG. 1 is an illustration of a group of devices chained together to form a composite receiving coil. The system of FIG. 1 includes a power transmitting unit 100, configured to wirelessly transmit power to one or more power receiving units 102. The power receiving units 102 may be a part of a multirobot system, such as a system of swarmbots. The power transmitting unit 100 may be configured to use magnetic resonance charging or inductive charging. The power transmitting unit includes an embedded transmit coil. The position of the transmit coil is indicated by the shaded area 104. The transmit coil may have any number of windings. In the case of multiple windings, the shaded area 104 may be considered to represent the outer winding of the transmit coil.

The power receiving units 102 may be miniature IoT devices, robotic devices, and others. Due the difference in size between the power transmitting coil and the power receiving units 102, it will be appreciated that if a receiving coil is fully contained within power receiving units 102, the power transmission efficiency would be very low. In accordance with the present techniques, the power transmission efficiency is improved by chaining the power receiving units 102 together to form a larger composite receive coil. Each power receiving unit 102 in the composite receive coil is linked to its neighbor through a conductive link 106. One example of a conductive link is described further in relation to FIGS. 2 and 3.

In some examples, the power receiving units 102 are mobile networked devices, which are able to arrange themselves into the chained configuration autonomously, i.e., without human intervention. The number of power receiving units 102 included in the chain may vary depending on the number of power receiving units 102 available, the power needs of the power receiving units 102, the size of the power transmitting coil, the sizes of the power receiving units 102 and their associated links, among others. For example, the power receiving units 102 may be configured to form a chain that approximates the size of the power transmitting coil, in which case the number of power receiving units 102 included in the chain may be selected based on the size of resulting chain compared to the size of the transmitting coil. In some instances, this may mean that one or more power receiving units 102 may be excluded from the chain to reduce the size of the chain. If one or more power receiving units 102 are excluded, those power receiving units 102 with the lowest battery charge levels may be selected to be a part of the chain.

Additionally, in some instances, one or more power receiving units 102 may be included in the chain despite having a full or close to full battery charge. This can enable the group of power receiving units 102 to form a larger chain that more closely matches the size of the power transmitting coil. In some examples, an individual operating mode may be implemented for each power receiving unit 102 depending on current charge level for the power receiving unit 102. The operating mode determines the amount of energy coupled into the power receiving unit 102 from the composite receive coil. For example, in some instances, a fully charged power receiving unit 102 may enter a standby mode wherein the power receiving unit 102 draws no charge from the composite receive coil.

Each of the power receiving units 102 has the capability to communicate with each other in order to coordinate their movement and arrangement into a chain. Coordination between the power receiving units 102 may be accomplished through a master/slave mechanism, in which one of the power receiving units 102 is designated as the master unit and the remaining power receiving units 102 are designated as nodes. The master unit can give instructions to the nodes and, in some examples, can also communicate with the power transmitting unit 100.

Figure 2:
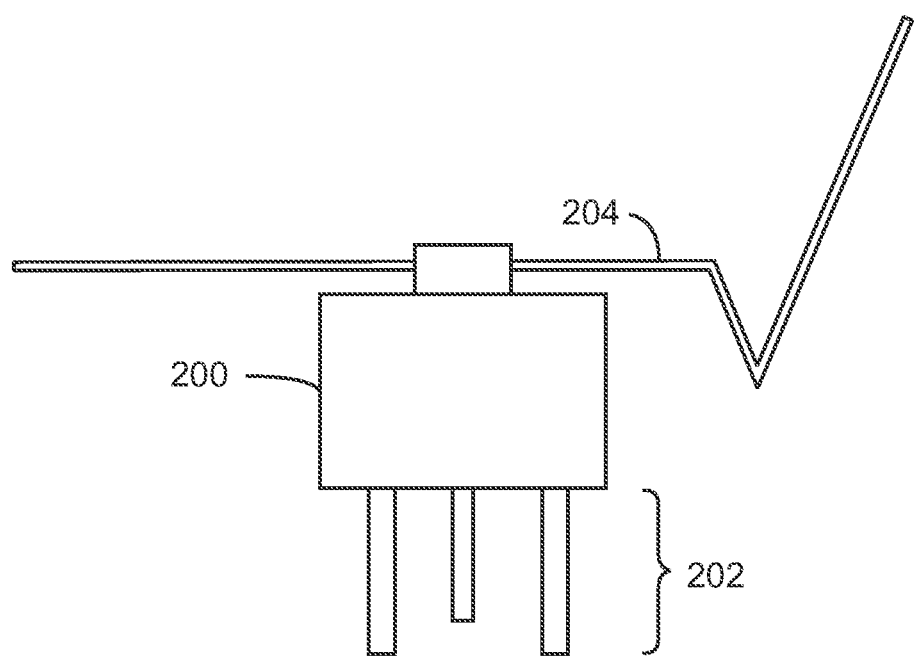
FIG. 2 is an example of a power receiving unit that can be configured to form a composite receiving coil with other power receiving units 102.

FIG. 2 is an example of a power receiving unit that can be configured to form a composite receiving coil with other power receiving units 102. The power receiving unit 102 includes a housing 200, a transportation mechanism 202, and a conductive link 204. The housing 200 can hold some or all of the electronics included in the power receiving units 102, such as the processors, memory, sensors, motor control circuitry, and others. The transportation mechanism 202 may be any mechanism that enables controlled movement. FIG. 2 shows a transportation mechanism that includes three movable legs that enable the device to perform a walking-type of motion. However, other transportation mechanisms are possible, including wheals, tracks, and others. The height of the power receiving unit 102 may be on the order of one to several centimeters. However, the techniques described herein can be employed in smaller or larger devices.

The conductive link 204 is a solid conductor that enables the power receiving unit 102 to form a composite receiving coil with other power receiving units 102. The conductive link shown in FIG. 2 is only one example of a possible conductive link and other shapes and sizes are possible. The conductive link 204 shown in FIG. 2 is shaped to be able to reliably form a conductive connection with its neighbors even in cases where there may be high degree of uncertainty in the relative positions of the power receiving units 102. The conductive link 204 may be partially contained within the housing 200, which may contain a small motor configured to rotate the conductive link 204. While attempting to conductively couple to a neighboring device, the conductive link can be rotated to enable it to locate the conductive link of its neighbor. This feature is shown is FIG. 3.

Figure 5:
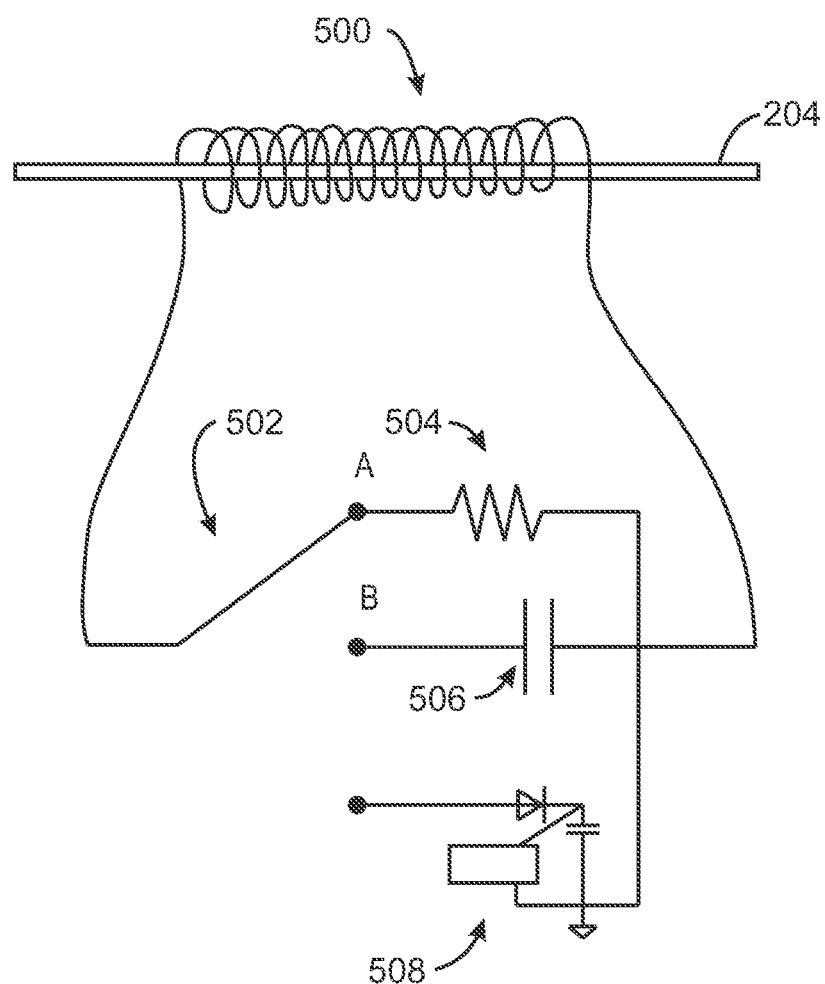
FIG. 5 is an example of the charge circuitry that can be implemented in each power receiving unit 102.

The housing 200 may also include a small coil and other circuitry, which can be wrapped around the conductive link as a way of coupling a portion of the electrical energy generated in the conductive link. An example circuit that can be used by the power receiving units to couple energy from the composite receive coil is shown in FIG. 5.

Figure 3:
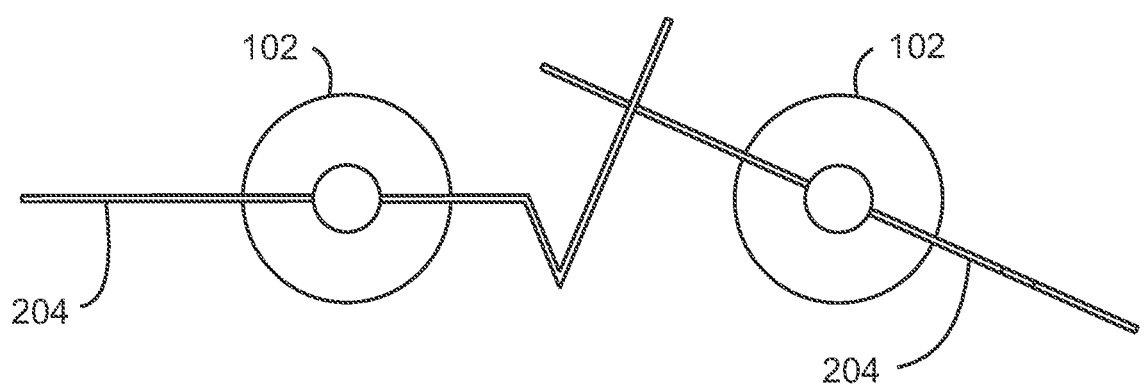
FIG. 3 is an illustration showing an example technique for forming a conductive connection with a neighboring power receiving unit.

FIG. 3 is an illustration showing an example technique of forming a conductive connection with a neighboring power receiving unit. FIG. 3 shows a top view of two power receiving units 102 forming a portion of a composite receive coil. When a power receiving unit 102 is in the correct position specified for that power receiving unit 102, the power receiving unit 102 may begin searching for the conductive link of its neighbor. The power receiving units 102 are to be aligned such that the straight side of the conductive link 204 is oriented toward the bent side of neighbor's conductive link 204. To search for the conductive link of the neighbor, the power receiving unit 102 rotates its own conductive link 204 until contact is made with neighbor's conductive link 204. Contact can be detected by detecting the completion of an electrical circuit, for example. The fully formed composite receive coil can include several such power receiving units 102 operating in substantially the same manner.

Figure 4:
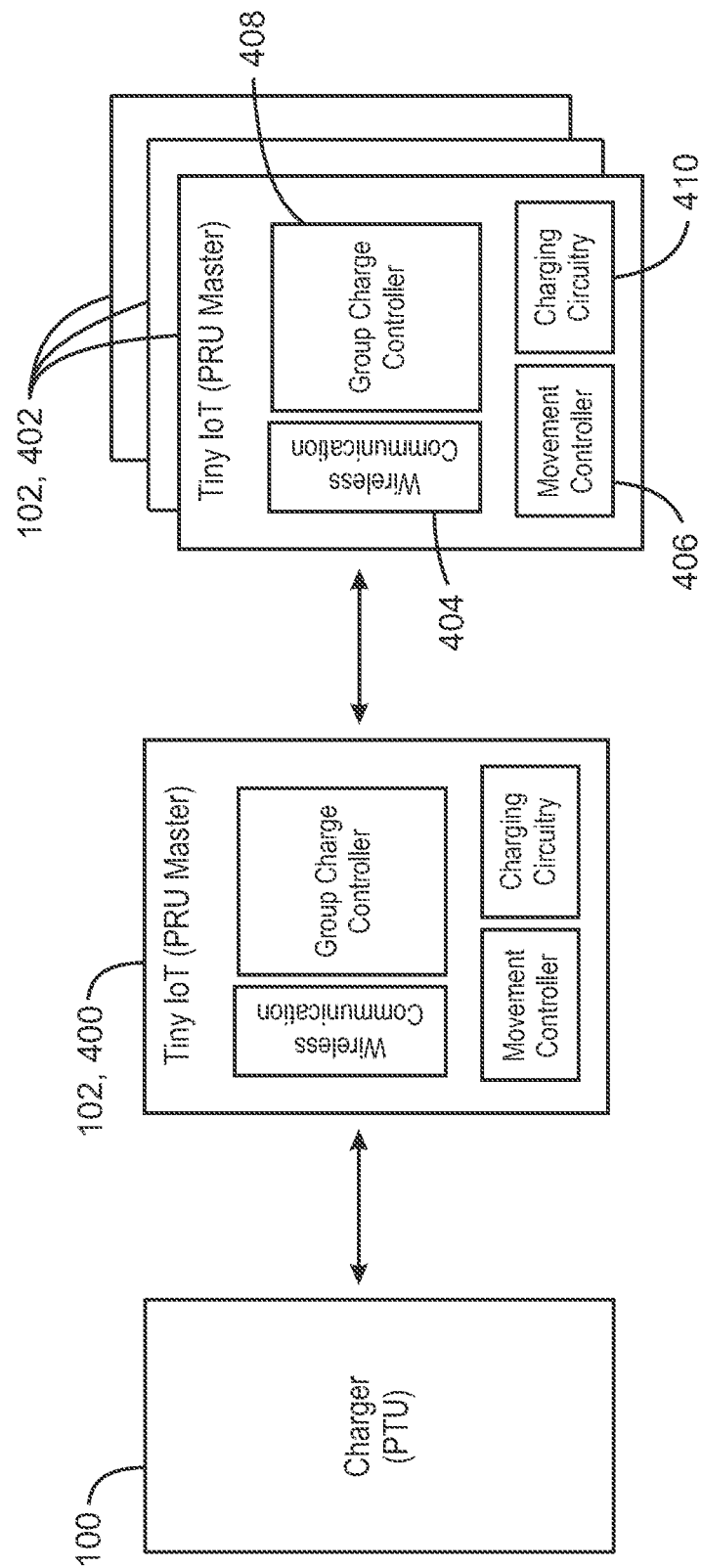
FIG. 4 is a block diagram of an example wireless charging system configured to implement the techniques described herein.

FIG. 4 is a block diagram of an example wireless charging system configured to implement the techniques described herein. The wireless charging system 400 includes the power transmitting unit 100, and multiple power receiving units 102. Each power receiving unit 102 may include substantially the same hardware and programming. The example power receiving units 102 shown in FIG. 4 include a wireless communication module 404, movement controller 406, group charge controller 408, and charging circuitry 410. These elements may be implemented as hardware or a combination of hardware and programming. For example, the modules may be implemented in circuits such logic gates, flip flops, buffers, operational amplifiers (op amps), transistors, and the like. The modules may also be implemented in one or more integrated circuits such as a microprocessor, an Application Specific Integrated Circuit (ASIC), a Field Programmable Gate Array (FPGA), and others. The modules may also be programming code stored on a tangible, non-transitory, computer-readable medium as. The programming code includes instructions that direct a processor to implement the processes described herein.

The chain of power receiving units 102 act together as a single wirelessly chargeable entity from the perspective of the power transmitting unit 100. One of the power receiving units 102 acts as a master unit 400, which is able to take control of the other receiving units 102, referred to herein as nodes 402. The master unit 400 also communicates with the power transmitting unit 100 to negotiate power transfer for the group. The communication between the master unit 400 and the power transmitting unit 100 may be in accordance with any suitable standard protocol, such as a specification provided by Alliance For Wireless Power (A4WP), Wireless Power Consortium (WPC), and others. However, the techniques described herein may be implemented using any other wireless charging standard protocol where applicable.

The wireless communication module 404 enables communication between the power receiving units 102 and between the master unit 400 and the power transmitting unit 100. In some examples, each node will have a unique identifier that can be communicated to the master unit 400. The unique identifier enables the master unit 400 to target commands to specific nodes 402 and recognize the messages received from specific nodes 402. If the master experiences some sort of operational failure, such as running out of battery of power, one of the nodes 402 may be reassigned to the role as master.

The movement controller 406 controls movement of its respective power receiving unit 102. The charging circuitry 410 includes the circuitry used by the power receiving units 102 to draw a charge from the composite receive coil and control the operating mode of the individual power receiving unit 102.

The group charge controller 408 of the master unit 400 is configured to collect charge session requests from the nodes 402 and determine a suitable coil configuration. The coil configuration describes a number of factors including the positions of the power receiving units 102 and the operating mode used by each of the power receiving units 102. The group charge controller 408 also sends commands to the nodes 402 to bring them to appropriate position and cause them to connect to their peers. The group charge controller 408 may also specify a suitable operating mode for each node 402. The group charge controller 408 can also monitor charging session states such as whether each node 402 are in the correct position, electrically coupled to its neighbor, whether the group is ready for charging, whether the nodes 402 are charged, and others.

The group charge controller 408 in each node 402 accepts control commands from the group charge controller 408 of the master unit 400 and controls its own charging circuitry 410. The group charge controller 408 in each node 402 can also report its state to the group charge controller 408 of the master 400. For example, the group charge controller 408 for a particular node 402 can report whether it is in the correct position, whether it is electrically coupled to its neighbors, its current charge level, and others.

FIG. 5 is an example of the charge circuitry that can be implemented in each power receiving unit 102. The charge circuitry 410 shown in FIG. 5 can be used to implement three different operating modes. The charge circuitry 410 includes a receive coil 500 wrapped around the conductive link 204 to receive energy from the conductive link 204 during charging.

The charge circuitry 410 also includes a switch 502 that can be engaged to activate one of three different operating modes. The positions of the switch 502 are labeled A, B, and C. At position A, the charge circuitry 410 engages a bypass mode, wherein the ends of the coil 500 are coupled through a resistor 502. In the bypass mode, the power receiving unit 102 does not receive a charge. The bypass mode may be useful to enable the power receiving unit 102 to help complete the composite receive coil even though the battery is charged. In some examples, the coil 500 may be short circuited at position A, i.e., the resistance of the resistor may be zero Ohms.

At position B, the charge circuitry 410 engages a capacitor mode, wherein the coil 500 is coupled to a capacitor 506. Coupling a capacitor to the receive coil 500 enables the master power receiving unit to control the impedance of the composite receive coil and thereby improve the overall efficiency of the power transfer from the transmit coil to the composite receive coil.

At position C, the charge circuitry 410 engages the charging mode, wherein the coil is coupled to battery charging circuitry 508. The master power receiving unit 102 may control each one of the nodes to be in bypass mode, capacitor mode, or charging mode. In this way, the master power receiving unit 102 will be able to prioritize charging for low battery devices, and to improve overall efficiency by controlling the impedance of the composite receive coil.

The charging circuitry 410 shown in FIG. 5 is one example of a possible charging circuit that can be implemented in accordance with the present techniques. The charge circuitry 410 may include any other suitable configurations and may implement more or fewer charging modes.

Figure 6A:
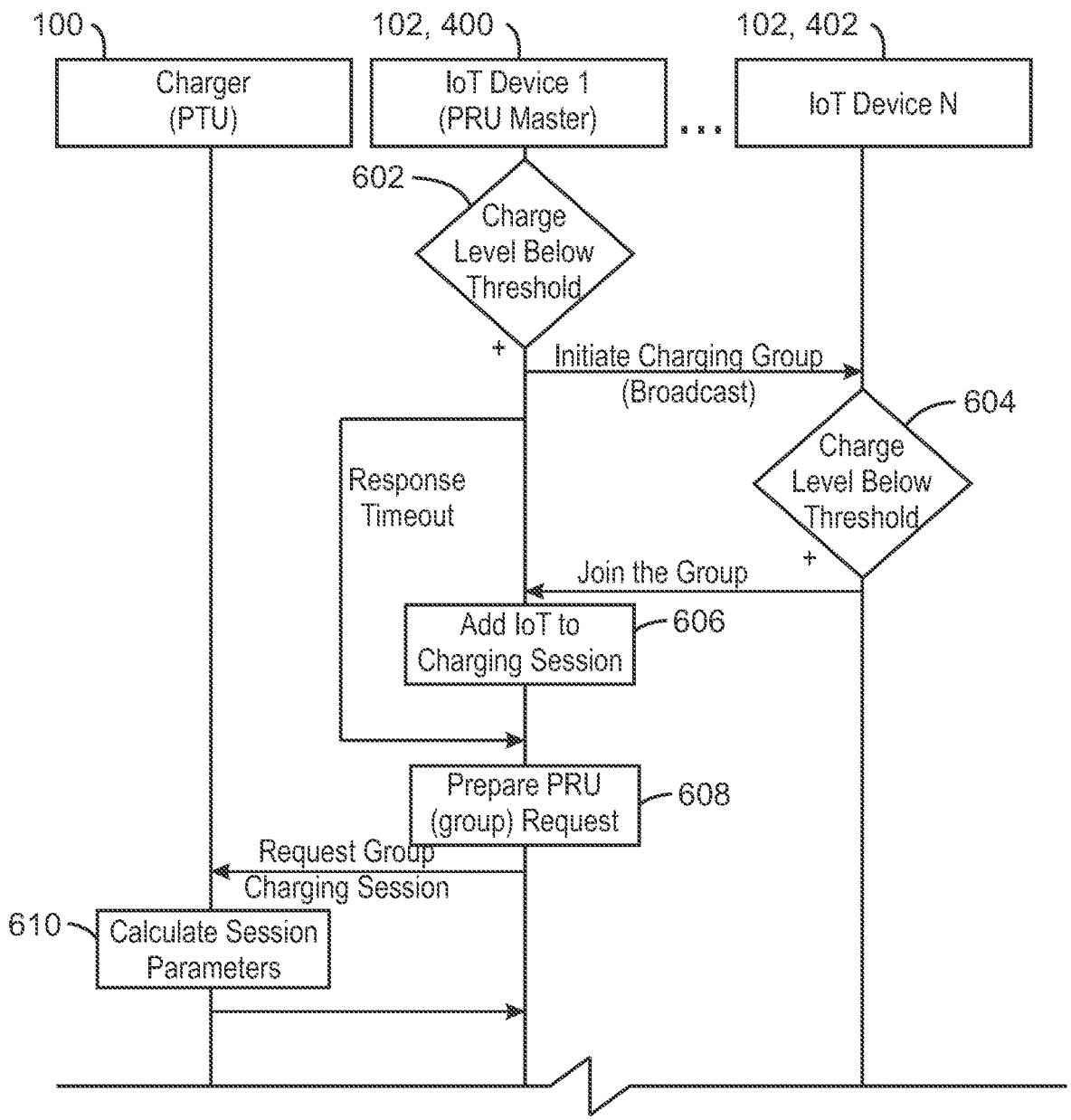
FIG. 6 is a process flow diagram of an example method of performing a charge session using the system described in FIG. 4.
Figure 6B:
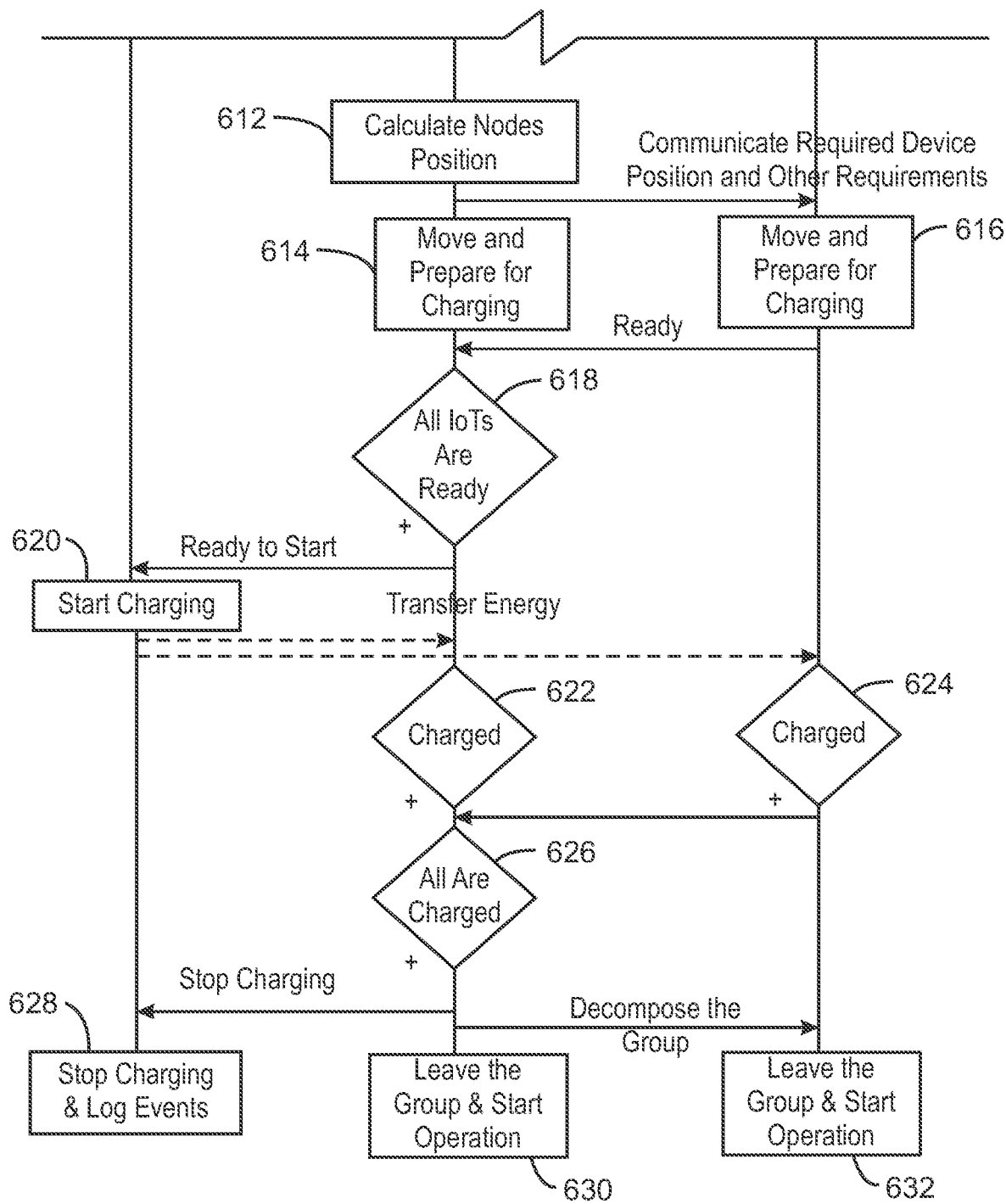

FIG. 6 is a process flow diagram of an example method of performing a charge session using the system described in FIG. 4. The process 600 begins at block 602, wherein the master unit 400 determines that the charge level of the power receiving units 102 is below a specified threshold. In some examples, this determination is made when the charge level of any single power receiving unit 102 is below the specified threshold. Upon making this determination, the master unit 400 broadcasts a command to the nodes 402 to initiate a charging group.

Upon receiving the command to initiate a charging group, each node determines whether its own charge level is below a specified threshold. If a node's charge level is below the threshold, the node will send a request at block 604 to join the group to the master unit 400.

At block 606, the master unit 400 receives the request and adds the node to the charging session. In cases where there are more nodes 402 than are needed to form the composite receive coil, the master unit 400 can prioritize which nodes are added to the charge group based on their comparative charge levels. In cases where there are fewer nodes 402 than are needed to form the composite receive coil, the master unit 400 may request one or more additional nodes to join the group even though their charge levels are above the threshold.

At block 608, the charging group has been defined and the master unit 400 sends a request to the power transmitting unit 100 requesting the start of a charge session. Depending on the wireless charging protocol used, the request may include several request parameters, such a device identifier, a requested power level, maximum power peak (current and voltage), time interval for periodic report updates, and others.

At block 610, the power transmitting unit calculates session parameters, which may include agreed upon current and voltage parameters, estimated charging time, and others. The session parameters are communicated to the master unit 400.

At block 612, the master unit 400 determines the positions of the each of the nodes 402. At this block, the master unit 400 can also determine the operating mode of each node 402, e.g., the bypass mode, capacitor mode, or charging mode. The master unit 400 communicates the positions and operating modes to each of the nodes 402.

At block 614 and 616, the master unit 400 and the nodes 402 attempt to move to their assigned positions and make conductive contact with their neighbors through the conductive links. Each node 402 may also engage the particular operating mode assigned to it by the master unit 400. Once a node 402 senses that it is in the correct position and making conductive contact with its neighbor, it can send a ready signal to the master unit 400.

At block 618, the master unit 400 determines that all of the power receiving units 102 is in their proper positions as part of the composite receive coil. At this time, the master unit 402 signals to the power transmitting unit 100 that it is ready to begin receiving power.

At block 620, the power transmitting unit 100 energizes the transmit coil and begins transferring energy wirelessly to the composite receive coil. As the energy is transferred one, some, or all of the power receiving units 102 draw a portion of the energy induced on the composite receive coil.

At blocks 622 and 624 the individual power receiving units 102 become fully charged. When a node 402 becomes fully charged, it can signal this to the master unit 400. Also, when a node 402 becomes fully charged, it can transition from the charging mode to the bypass mode or the capacitor mode. The transition from the charging mode may be triggered by the node 402 itself or in response to a message received from the master unit 400.

At block 626, the master unit 400 determines that all of the powers receiving devices 402 are charged. The master unit 400 then signals to the power transmitting unit 100 to stop charging. The master unit also signals to the nodes 402 to decompose the charge group.

At block 628, the master unit 100 stops transmitting power. At this time, the master unit 100 may also generate a log entry. The log entry may record event information such as the charging of specific devices, the time at which the charging for this devices was completed, and the like.

At blocks 630 and 632, the power receiving units 102 leave the charging group and restart normal operation.

The process shown in FIG. 6 is only one example of a process that may be implemented in accordance with the techniques described herein. The process 600 should not be interpreted as meaning that the blocks are necessarily performed in the order shown. Furthermore, fewer or greater actions can be included in the process 600 depending on the design considerations of a particular implementation.

Figure 7:
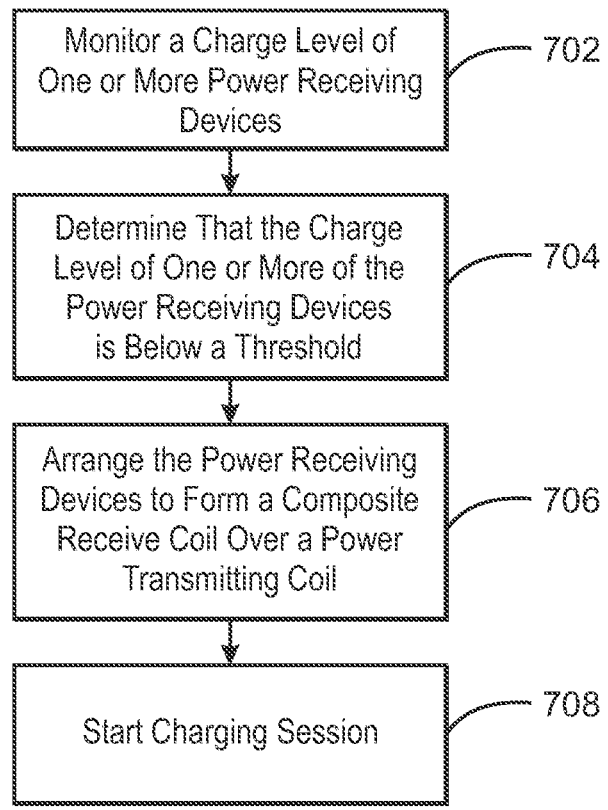
FIG. 7 is a process flow diagram summarizing a method of charging a plurality of power receiving units through the formation of a composite receiving coil.

FIG. 7 is a process flow diagram summarizing a method of charging a plurality of power receiving units through the formation of a composite receiving coil. The method may be performed by a power receiving unit such as the master unit 400 which is in communication with a number of other power receiving units configured as nodes 402 as shown in FIG. 4. The method may begin at block 702.

At block 702, a charge level of one or more power receiving units is monitored. The monitoring may be performed by receiving messages from the nodes, each of which sense their own battery charge level and report to the master unit. In some examples, the master unit 400 periodically polls the nodes to request charge level data. The master unit also senses its own battery charge level.

At block 704, a determination is made that the charge level of one or more of the power receiving units is below a threshold. The charge level may be the battery charge level of the master unit or one or more of the nodes.

At block 706, some or all of the power receiving units are arranged to form a composite receive coil over a power transmitting coil. The power receiving units are positioned over the power transmitting coil and conductively coupled to one another through conductive links to form the composite receive coil, which may be close to the same size as the power transmitting coil. The power receiving units may be robotic devices that can receive instructions from the master unit and autonomously move to the correct position and engage its conductive link to couple to its neighbor.

At block 708, the charge session is started. The charge session can be started by the master unit, which communicates with the power transmitter after it has confirmed that the composite coil is correctly configured.

The method 700 should not be interpreted as meaning that the blocks are necessarily performed in the order shown. Furthermore, fewer or greater actions can be included in the method 700 depending on the design considerations of a particular implementation.

EXAMPLES

Example 1 is a power receiving unit. The power receiving unit includes a transportation mechanism to enable the power receiving unit to move and a wireless communication system to enable the power receiving unit to communicate with a plurality of other power receiving units. The power receiving unit is a master unit and the plurality of other power receiving units are nodes that take commands from the master unit. The power receiving unit also includes a controller to command the nodes to form a composite receive coil positioned over a power transmitting unit and communicate with the power transmitting unit to start a charging session.

Example 2 includes the power receiving unit of example 1, including or excluding optional features. In this example, the controller is to monitor a battery charge level of each of the nodes and determine that the battery charge level of at least one of the nodes is below a threshold.

Example 3 includes the power receiving unit of any one of examples 1 to 2, including or excluding optional features. In this example, the power receiving unit includes charge circuitry that enables the power receiving unit to draw a portion of the energy from the composite receive coil to charge a battery of the power receiving unit. Optionally, the charge circuitry includes a coil that inductively couples energy from the composite receive coil.

Example 4 includes the power receiving unit of any one of examples 1 to 3, including or excluding optional features. In this example, each of the nodes is configured to activate one of a plurality of operating modes during the charging session. Optionally, the plurality of operating modes includes a bypass mode that prevents the nodes from coupling energy from the composite receive coil. Optionally, the master unit determines which one of the plurality of operating modes will be activated during the charging session.

Example 5 includes the power receiving unit of any one of examples 1 to 4, including or excluding optional features. In this example, the power receiving unit includes a conductive link that enables the power receiving unit to conductively couple to one of the nodes to form the composite receive coil.

Example 6 includes the power receiving unit of any one of examples 1 to 5, including or excluding optional features. In this example, the conductive link includes a metal pin that is bent at one end and is to be rotated to make contact with another conductive link of one of the nodes.

Example 7 includes the power receiving unit of any one of examples 1 to 6, including or excluding optional features. In this example, the power receiving unit is an Internet of Things (IoT) device.

Example 8 is a method of wirelessly charging a plurality of power receiving units. The method includes monitoring a charge level of each one of the plurality of power receiving units and determining that the charge level of at least one of the power receiving units is below a threshold. The method also includes arranging the plurality of power receiving units to form a composite receive coil positioned over a transmitting coil of a power transmitting unit and starting a charge session with the power transmitting unit.

Example 9 includes the method of example 8, including or excluding optional features. In this example, one of the plurality of power receiving units is assigned the role of master, wherein the master communicates with the power transmitting unit to start the charge session.

Example 10 includes the method of any one of examples 8 to 9, including or excluding optional features. In this example, the method includes determining an assigned position for each of the power receiving units and communicating the assigned position to the power receiving units, wherein the power receiving units autonomously move to the assigned positions.

Example 11 includes the method of any one of examples 8 to 10, including or excluding optional features. In this example, each of the power receiving units includes a conductive link configured to form a portion of the composite receive coil. Optionally, to form the composite receive coil each of the power receiving units rotates its conductive link until it makes contact with the conductive link of its neighbor.

Example 12 includes the method of any one of examples 8 to 11, including or excluding optional features. In this example, the method includes selecting operating modes to be engaged during the charging session by the power receiving units, wherein the operating modes determine how charge circuitry of each of the power receiving units is coupled to the composite receive coil. Optionally, selecting operating modes includes selecting a bypass mode for a particular power receiving unit of the power receiving units so that the particular power receiving unit does not draw power from the composite receive coil. Optionally, selecting operating modes includes selecting a capacitor mode for a particular power receiving unit of the power receiving units so that the particular power receiving unit adjusts an impedance of the composite receive coil. Optionally, selecting operating modes includes selecting a charge mode for a particular power receiving unit of the power receiving units so that the particular power receiving unit draws a charge from the composite receive coil for charging a battery.

Example 13 includes the method of any one of examples 8 to 12, including or excluding optional features. In this example, the method includes determining that each of the power receiving units is fully charged, ending the charge session and decomposing the composite receive coil.

Example 14 is a tangible, non-transitory, computer-readable medium including instructions that, when executed by a processor, direct the processor to control a wireless charging session. The computer-readable medium includes instructions that direct the processor to monitor a charge level of each one of a plurality of power receiving units and determine that the charge level of at least one of the power receiving units is below a threshold. The instructions also direct the processor to arrange the plurality of power receiving units to form a composite receive coil positioned over a transmitting coil of a power transmitting unit and start a charge session with the power transmitting unit.

Example 15 includes the computer-readable medium of example 14, including or excluding optional features. In this example, the computer-readable medium includes instructions to assign one the plurality of power receiving units as a master unit, wherein the master unit communicates with the power transmitting unit to start the charge session.

Example 16 includes the computer-readable medium of any one of examples 14 to 15, including or excluding optional features. In this example, the computer-readable medium includes instructions to determine an assigned position for each of the power receiving units and communicate the assigned position to the power receiving units, wherein the power receiving units autonomously move to the assigned positions.

Example 17 includes the computer-readable medium of any one of examples 14 to 16, including or excluding optional features. In this example, each of the power receiving units includes a conductive link configured to form a portion of the composite receive coil. Optionally, the computer-readable medium includes instructions to direct each of the power receiving units to rotate its conductive link until it makes contact with the conductive link of its neighbor.

Example 18 includes the computer-readable medium of any one of examples 14 to 17, including or excluding optional features. In this example, the computer-readable medium includes instructions to select operating modes to be engaged during the charging session by the power receiving units, wherein the operating modes determine how charge circuitry of each of the power receiving units is coupled to the composite receive coil. Optionally, the instructions to select operating modes select a bypass mode for a particular power receiving unit of the power receiving units so that the particular power receiving unit does not draw power from the composite receive coil. Optionally, the instructions to select operating modes select a capacitor mode for a particular power receiving unit of the power receiving units so that the particular power receiving unit adjusts an impedance of the composite receive coil. Optionally, the instructions to select operating modes select a capacitor mode for a particular power receiving unit of the power receiving units so that the particular power receiving unit draws a charge from the composite receive coil for charging a battery.

Example 19 includes the computer-readable medium of any one of examples 14 to 18, including or excluding optional features. In this example, the computer-readable medium includes instructions to determine that each of the power receiving units is fully charged, end the charge session, and decompose the composite receive coil.

Example 20 is an apparatus configured to wirelessly charging a plurality of power receiving units. The apparatus includes means for monitoring a charge level of each one of the plurality of power receiving units and means for determining that the charge level of at least one of the power receiving units is below a threshold. The apparatus also includes means for arranging the plurality of power receiving units to form a composite receive coil over a transmitting coil of a power transmitting unit and means for starting a charge session with the power transmitting unit.

Example 21 includes the apparatus of example 20, including or excluding optional features. In this example, one of the plurality of power receiving units is assigned the role of master, wherein the master communicates with the power transmitting unit to start the charge session.

Example 22 includes the apparatus of any one of examples 20 to 21, including or excluding optional features. In this example, the apparatus includes means for determining an assigned position for each of the power receiving units and means for communicating the assigned position to the power receiving units, wherein the power receiving units include means for autonomously moving to the assigned positions.

Example 23 includes the apparatus of any one of examples 20 to 22, including or excluding optional features. In this example, each of the power receiving units includes a conductive link configured to form a portion of the composite receive coil. Optionally, to form the composite receive coil each of the power receiving units rotates its conductive link until it makes contact with the conductive link of its neighbor.

Example 24 includes the apparatus of any one of examples 20 to 23, including or excluding optional features. In this example, the apparatus includes means for selecting operating modes to be engaged during the charging session by the power receiving units, wherein the operating modes determine how charge circuitry of each of the power receiving units is coupled to the composite receive coil. Optionally, the means for selecting operating modes includes means for selecting a bypass mode for a particular power receiving unit of the power receiving units so that the particular power receiving unit does not draw power from the composite receive coil. Optionally, the means for selecting operating modes includes means for selecting a capacitor mode for a particular power receiving unit of the power receiving units so that the particular power receiving unit adjusts an impedance of the composite receive coil. Optionally, the means for selecting operating modes includes means for selecting a capacitor mode for a particular power receiving unit of the power receiving units so that the particular power receiving unit draws a charge from the composite receive coil for charging a battery.

Example 25 includes the apparatus of any one of examples 20 to 24, including or excluding optional features. In this example, the apparatus includes means for determining that each of the power receiving units is fully charged and ending the charge session and decomposing the composite receive coil.

Example 26 is a multirobot system. The multirobot system includes a plurality of Internet of Things (IoT) devices, wherein one of the plurality of IoT devices is a master and a remainder of the plurality of IoT devices are nodes. The master is configured to monitor a charge level of each of the nodes and determine that the charge level of at least one of the nodes is below a threshold. The master is also configured to arrange the nodes to form a composite receive coil positioned over a transmitting coil of a power transmitting unit and start a charge session with the power transmitting unit.

Example 27 includes the multirobot system of example 26, including or excluding optional features. In this example, if the master fails, one of the nodes is reassigned a new role as a new master.

Example 28 includes the multirobot system of any one of examples 26 to 27, including or excluding optional features. In this example, the master is configured to determine an assigned position for each of the nodes and communicate the assigned position to the nodes, wherein the nodes autonomously move to the assigned positions.

Example 29 includes the multirobot system of any one of examples 26 to 28, including or excluding optional features. In this example, each of the nodes includes a conductive link configured to form a portion of the composite receive coil. Optionally, each node direct is configured to rotate its conductive link until it makes contact with the conductive link of its neighbor.

Example 30 includes the multirobot system of any one of examples 26 to 29, including or excluding optional features. In this example, the master is configured to select operating modes to be engaged during the charging session by the nodes, wherein the operating modes determine how charge circuitry of each of the nodes is coupled to the composite receive coil. Optionally, the operating modes include a bypass mode that prevents the nodes from drawing power from the composite receive coil. Optionally, the operating modes include a capacitor mode that causes the node to adjust an impedance of the composite receive coil. Optionally, the operating modes include a charging mode that causes the nodes to draw a charge from the composite receive coil for charging a battery.

Example 31 includes the multirobot system of any one of examples 26 to 30, including or excluding optional features. In this example, the master is configured to determine that each of the power receiving units is fully charged, end the charge session, and decompose the composite receive coil.

Some embodiments may be implemented in one or a combination of hardware, firmware, and software. Some embodiments may also be implemented as instructions stored on the tangible non-transitory machine-readable medium, which may be read and executed by a computing platform to perform the operations described. In addition, a machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. A power receiving unit comprising:
    a transportation mechanism to enable the power receiving unit to move;
    a wireless communication system to enable the power receiving unit to communicate with a plurality of other power receiving units, wherein the power receiving unit is a master unit and the plurality of other power receiving units are nodes that take commands from the master unit; and
    a controller to:
    command the nodes to form a composite receive coil over a power transmitting unit; and
    communicate with the power transmitting unit to start a charging session.

2. The power receiving unit of claim 1, wherein the controller is to monitor a battery charge level of each of the nodes and determine that the battery charge level of at least one of the nodes is below a threshold.

3. The power receiving unit of claim 1, comprising charge circuitry that enables the power receiving unit to draw a portion of the energy from the composite receive coil to charge a battery of the power receiving unit.

4. The power receiving unit of claim 3, wherein the charge circuitry comprises a coil that inductively couples energy from the composite receive coil.

5. The power receiving unit of claim 1, wherein each of the nodes is configured to activate one of a plurality of operating modes during the charging session.

6. The power receiving unit of claim 5, wherein the plurality of operating modes includes a bypass mode that prevents the nodes from coupling energy from the composite receive coil.

7. The power receiving unit of claim 5, wherein the master unit determines which one of the plurality of operating modes will be activated during the charging session.

8. The power receiving unit of claim 1, comprising a conductive link that enables the power receiving unit to conductively couple to one of the nodes to form the composite receive coil.

9. The power receiving unit of claim 8, wherein the conductive link comprises a metal pin that is bent at one end and is to be rotated to make contact with another conductive link of one of the nodes.

10. The power receiving unit of claim 1, wherein the power receiving unit is an Internet of Things (IoT) device.

11. A method of wirelessly charging a plurality of power receiving units, comprising:
    monitoring a charge level of each one of the plurality of power receiving units;
    determining that the charge level of at least one of the power receiving units is below a threshold;
    arranging the plurality of power receiving units to form a composite receive coil over a transmitting coil of a power transmitting unit; and
    starting a charge session with the power transmitting unit.

12. The method of claim 11, wherein one of the plurality of power receiving units is assigned the role of master, wherein the master communicates with the power transmitting unit to start the charge session.

13. The method of claim 11, comprising determining an assigned position for each of the power receiving units and communicating the assigned position to the power receiving units, wherein the power receiving units autonomously move to the assigned positions.

14. The method of claim 11, wherein each of the power receiving units comprises a conductive link configured to form a portion of the composite receive coil.

15. The method of claim 14, wherein to form the composite receive coil each of the power receiving units rotates its conductive link until it makes contact with the conductive link of its neighbor.

16. The method of claim 11, comprising selecting operating modes to be engaged during the charging session by the power receiving units, wherein the operating modes determine how charge circuitry of each of the power receiving units is coupled to the composite receive coil.

17. The method of claim 16, wherein selecting operating modes comprises selecting a bypass mode for a particular power receiving unit of the power receiving units so that the particular power receiving unit does not draw power from the composite receive coil.

18. The method of claim 16, wherein selecting operating modes comprises selecting a capacitor mode for a particular power receiving unit of the power receiving units so that the particular power receiving unit adjusts an impedance of the composite receive coil.

19. The method of claim 16, wherein selecting operating modes comprises selecting a capacitor mode for a particular power receiving unit of the power receiving units so that the particular power receiving unit draws a charge from the composite receive coil for charging a battery.

20. The method of claim 11, comprising determining that each of the power receiving units is fully charged, ending the charge session and decomposing the composite receive coil.

21. A tangible, non-transitory, computer-readable medium comprising instructions that, when executed by a processor, direct the processor to control a wireless charging session, the instructions to control the processor to:
    monitor a charge level of each one of a plurality of power receiving units;
    determine that the charge level of at least one of the power receiving units is below a threshold;
    arrange the plurality of power receiving units to form a composite receive coil over a transmitting coil of a power transmitting unit; and
    start a charge session with the power transmitting unit.

22. The computer-readable medium of claim 21, comprising instructions to assign one the plurality of power receiving units as a master unit, wherein the master unit communicates with the power transmitting unit to start the charge session.

23. The computer-readable medium of claim 21, comprising instructions to determine an assigned position for each of the power receiving units and communicate the assigned position to the power receiving units, wherein the power receiving units autonomously move to the assigned positions.

24. The computer-readable medium of claim 21, wherein each of the power receiving units comprises a conductive link configured to form a portion of the composite receive coil.

25. The computer-readable medium of claim 24, comprising instructions to direct each of the power receiving units to rotate its conductive link until it makes contact with the conductive link of its neighbor.

\* \* \* \* \*